US006957906B2

United States Patent
Coushaine et al.

(10) Patent No.: US 6,957,906 B2
(45) Date of Patent: Oct. 25, 2005

(54) LED LIGHT SOURCE MIMICKING A FILAMENTED LAMP

(75) Inventors: Charles M. Coushaine, Rindge, NH (US); Steve C. Sidwell, Hopkington, NH (US); Michael Tucker, Henniker, NH (US); Thomas Tessnow, Weare, NH (US)

(73) Assignee: Osram Sylvania Inc., Danvers, MA (US)

( * ) Notice: Subject to any disclaimer, the term of this patent is extended or adjusted under 35 U.S.C. 154(b) by 0 days.

(21) Appl. No.: 10/999,320

(22) Filed: Nov. 30, 2004

(65) Prior Publication Data

US 2005/0094417 A1   May 5, 2005

Related U.S. Application Data

(62) Division of application No. 10/314,714, filed on Dec. 9, 2002, now Pat. No. 6,880,962.

(51) Int. Cl.[7] .......................... H01L 33/00; G02B 6/42; F21V 8/00
(52) U.S. Cl. ...................... 362/555; 362/235; 362/248; 362/646; 362/800
(58) Field of Search ........................ 362/226, 234–236, 362/240, 248, 255, 310, 311, 351, 364, 429, 362/540–545, 555, 646, 800, 810; 313/318.01, 313/318.05, 318.12, 512, 500; 439/890

(56) References Cited

U.S. PATENT DOCUMENTS

| 3,691,390 A | * | 9/1972 | Chow et al. ................. 313/500 |
| 5,139,433 A | | 8/1992 | Bohaty |
| 5,160,200 A | | 11/1992 | Cheselske |
| 5,535,230 A | * | 7/1996 | Abe ............................ 362/259 |
| 5,810,463 A | * | 9/1998 | Kawahara et al. ........... 362/555 |
| 6,132,060 A | | 10/2000 | Gallo |
| 6,227,679 B1 | | 5/2001 | Zhang et al. |
| 6,357,902 B1 | | 3/2002 | Horowitz |
| 6,371,636 B1 | | 4/2002 | Wesson |
| 6,527,411 B1 | * | 3/2003 | Sayers ........................ 362/555 |
| 6,598,996 B1 | | 7/2003 | Lodhie |
| 6,637,924 B2 | * | 10/2003 | Pelka et al. .................. 362/555 |
| 6,737,811 B2 | * | 5/2004 | Zhang et al. ................ 362/555 |
| 6,796,698 B2 | * | 9/2004 | Sommers et al. ........... 362/555 |
| 2001/0026447 A1 | | 10/2001 | Herrera |
| 2001/0033488 A1 | | 10/2001 | Chliwnyj |
| 2003/0058658 A1 | | 3/2003 | Lee |

* cited by examiner

FOREIGN PATENT DOCUMENTS

GB          2311126           9/1997

Primary Examiner—Alan Cariaso
(74) Attorney, Agent, or Firm—William E. Meyer

(57) ABSTRACT

A solid-state light source (10) that is compatible with the existing sockets normally reserved for filamented lamps (100). The solid-state light source (10) comprises a hollow base (12) formed to mechanically and electrically adapt to an existing socket normally reserved for lamps (100). A sub-assembly (14) is adapted to cooperate with and fit into the hollow base (12). The sub-assembly (14) comprises a circuit board (16) with a plurality of solid-state light sources (18) mechanically and electrically connected to one side (20) of the circuit board. Two electrical contacts (22, 24) are positioned on the other side (26) of the circuit board for connection to an electrical circuit. A light pipe (28) covers the plurality of light sources (18) and extends away therefrom to a terminal end (30). A light radiator (34) is affixed to the terminal end (30) and a light-opaque shroud (33) surrounds the light pipe (32) to keep all of the light generated by the solid-state light source within the light pipe (32) to exit out of the light radiator (34).

6 Claims, 5 Drawing Sheets

LED LIGHT SOURCE MIMICKING A
FILAMENTED LAMP

CROSS-REFERENCE TO RELATED APPLICATIONS

This is a Divisional Application of LED Light Source Mimicking a Filamented Lamp, Ser. No. 10/314,714, issued as U.S. Pat. No. 6,880,962 filed by the present Applicant on Dec. 9, 2002, and the benefit of the filing dates of that application is hereby claimed for this Divisional Application.

TECHNICAL FIELD

This invention relates to light sources and more particularly to solid-state light sources. Still more particularly it relates to solid-state light sources that can be used with a reflector to mimic the light distribution pattern of an incandescent light. Still more particularly, it relates to solid-state light sources useable as direct replacements for automotive signal lighting, such as taillights.

BACKGROUND ART

Solid-state lighting, for example, light emitting diodes (hereinafter, LED) are known for their long life and their ability to resist shock. They have been used for some time as the high-mount stop light in automobiles, where no particular amplification or reflection of the light is needed. Attempts have been made in the past to adapt LEDs for other purposes such as taillight units; however, these attempts have applied LEDs typically encased in plastic beads to flat surfaces, which were then ganged on the cylindrical end of, for example, a bayonet base. Little or no light was directed to the reflector for proper light distribution. For the most part, these devices do not meet Federal regulations.

DISCLOSURE OF INVENTION

It is, therefore, an object of the invention to obviate the disadvantages of the prior art.

It is another object of the invention to enhance the utilization of solid-state light sources.

It is yet another object of the invention enhance the utilization of solid-state light sources in automotive applications.

These objects are accomplished, in one aspect of the invention, by the provision of a solid-state light source that is compatible with existing sockets normally reserved for filamented lamps. The light source comprises a hollow base that is formed to mechanically and electrically adapt to a socket and has a sub-assembly adapted to cooperate with and fit into the hollow base. The sub-assembly comprises a circuit board that has a plurality of solid-state light sources mechanically and electrically connected to one side of the circuit board. Two electrical contacts are positioned on the other side of the circuit board for connection to an electrical circuit. A light pipe covers the plurality of light sources and extends away therefrom to a terminal end. A light radiator is affixed to the terminal end and a light-opaque shroud surrounds the light pipe.

In a preferred embodiment of the invention the light radiator is formed to mimic the light distribution of a filamented lamp and the centerline of the radiator is the same distance from the base as would be the centerline of a filamented lamp. This procedure allows the solid-state light source to mimic the light distribution of a typical incandescent lamp.

BEST MODE FOR CARRYING OUT THE INVENTION

For a better understanding of the present invention, together with other and further objects, advantages and capabilities thereof, reference is made to the following disclosure and appended claims in conjunction with the above-described drawings.

Figure 1:
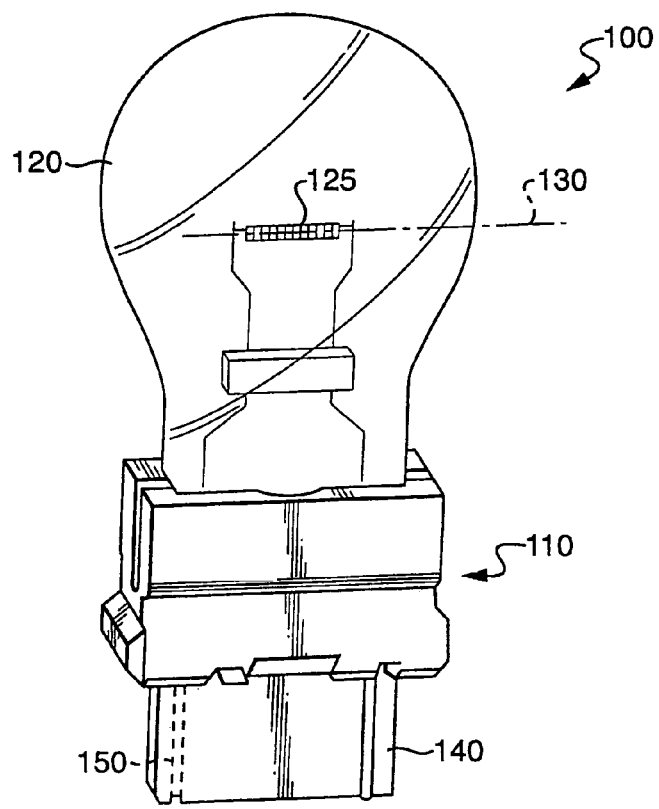
FIG. 1 is a perspective view of a prior art filamented lamp.

Referring now to FIG. 1 there is shown a prior art lamp for use with automobiles. The lamp 100 has a base 110 that is formed to fit with a standard socket, for example, of the type used for automobile taillights. The light source 120 is an incandescent bulb having a filament 125 arrayed along an axis 130. The height of the axis 130 is designed to mate effectively with the reflector with which the lamp is used. The electrical contacts 140 and 150 are fitted to the outside of the base 110, one on either side. There are millions of sockets available that accept this type of base and its associated incandescent bulb. The bulbs, of course, are replaceable since the filament has a limited life.

Figure 2:
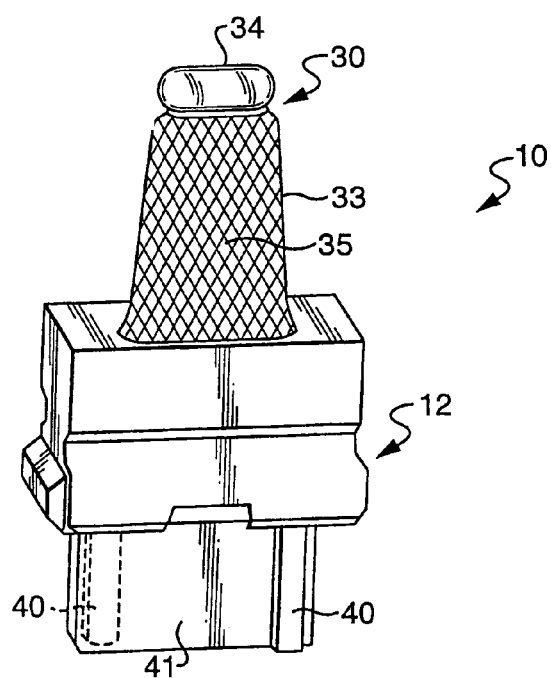
FIG. 2 is a perspective view of an embodiment of this invention.
Figure 3:
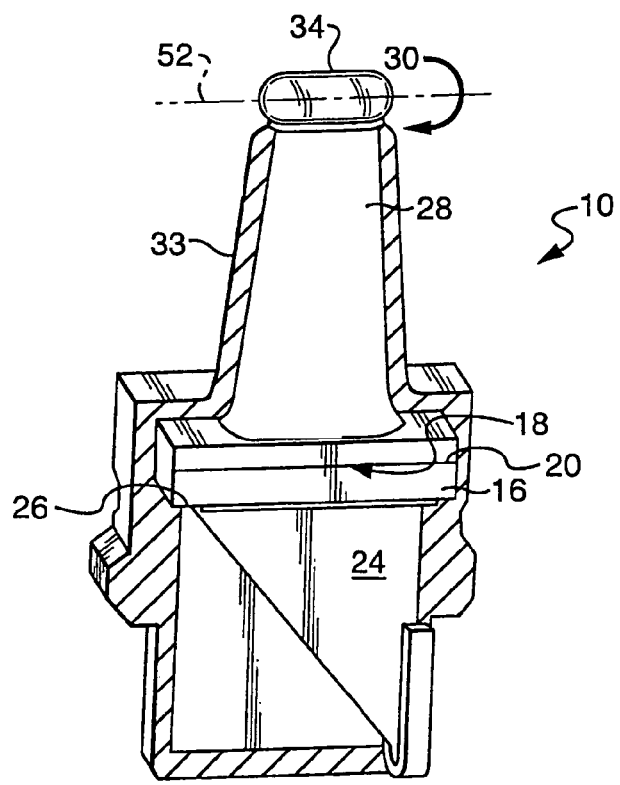
FIG. 3 is a perspective view of an embodiment of the invention, partially in section.
Figure 4:
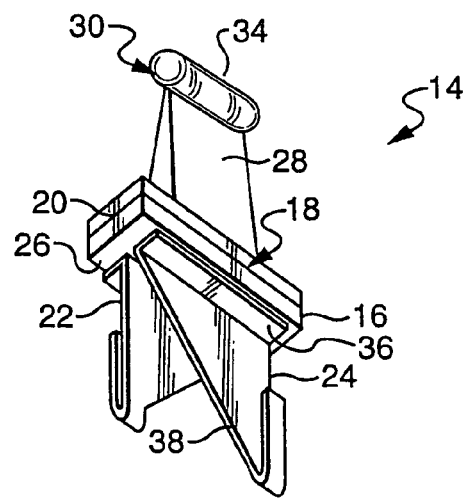
FIG. 4 is a perspective view of a sub-assembly of the invention.

Referring now to FIG. 2 there is shown a solid-state light source 10 that is compatible with the existing sockets normally reserved for filamented lamps 100. The solid-state light source 10 comprises a hollow base 12 formed to mechanically and electrically adapt to an existing socket normally reserved for lamps 100. A sub-assembly 14 (see FIG. 4) is adapted to cooperate with and fit into the hollow base 12. The sub-assembly 14 comprises a circuit board 16 with a plurality of solid-state light sources 18 mechanically and electrically connected to one side 20 of the circuit board 16. In the preferred embodiment an array of LEDs are mounted on a metal core board or other substrate providing good thermal conduction. It is preferred to mount the LEDs directly as "chip on board" and not indirectly as attached LED assemblies (TOPLEDS). Direct mounting ("chip on board") enables more efficient heat sinking and therefore greater light output, or longer life for the LEDs. For example, thermally coupling the circuit board 16 to the power leads 22, 24, can provide the heat sinking. Electrical traces formed on the circuit board 16 link the LEDs in a circuit and connect to the electrical contacts 22, 24 for power. The LEDs are preferably coated with a clear epoxy or silicon coating (not shown) as known in the art. The coating protects the wire connections, can enhance the light output and spread the heat conducted from the LED chips. The coating may be formed on the surface to the circuit board 16 to fit in a corresponding cavity in the optical light pipe 28 or the coating may fill a cavity formed between the light pipe 28 and the circuit board 16 and LEDs.

Figure 6:
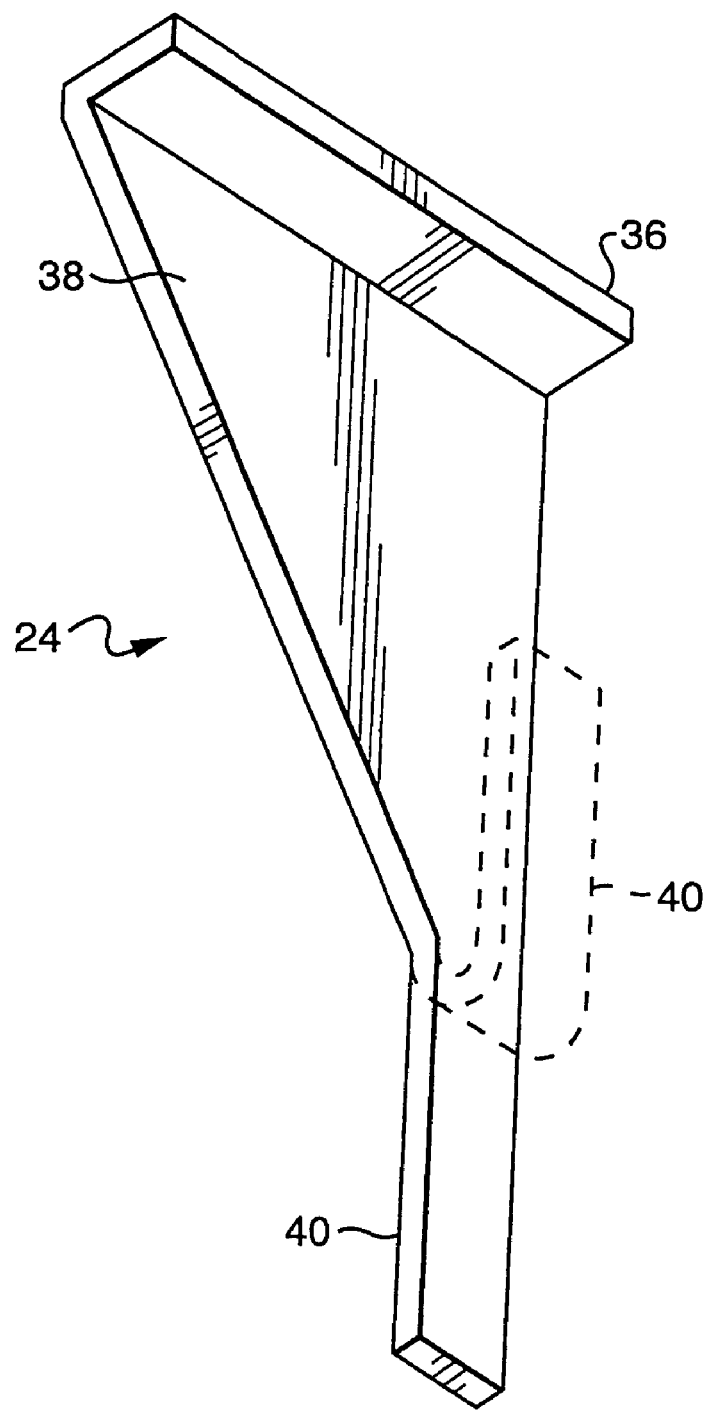
FIG. 6 is a perspective view of one of the electrical contacts useable with the invention.

Two electrical contacts 22, 24 are positioned on the other side 26 of the circuit board 16 for connection to an electrical circuit. The preferred electrical contacts 22, 24 each have an elongated flange 36, which is attached to the side 26 of the circuit board 16. The preferred electrical contacts 22, 24 include relatively large area portions, such as the triangular segment 38, that provide heat sinking for the circuit board 16. These depend from each of the flanges 36 and include terminal portions 40 that extend away from, as shown, the apex of the triangular segment 38. As shown in FIG. 6, as formed initially the terminal portion 40 extends straight away from the apex so that it can project through the bottom of the base 12. After the sub-assembly 14 is enclosed in the hollow base 12, the terminal portion 40 is bent back upon itself to seat on the external surface 41 of the base 12. The large triangular segments 38 act as heat sinks during operation of the light source to remove heat generated and disperse it through the socket.

In the preferred embodiment, the circuit board 16 supporting the LEDs and circuit traces is sandwiched between a light pipe 28 and the heat sinking features in the lamp base. A light pipe 28 covers the plurality of light sources 18 and extends away therefrom to a terminal end 30. The preferred light pipe 28 is formed from an optically clear material such as glass, polycarbonate, acrylic or other suitable plastic. In one embodiment the light pipe includes a lower end wall defining a cavity enclosing the LEDs to capture substantially all the light generated by the LEDs. The wall may also mate with the first side of the circuit board 16.

Figure 5:
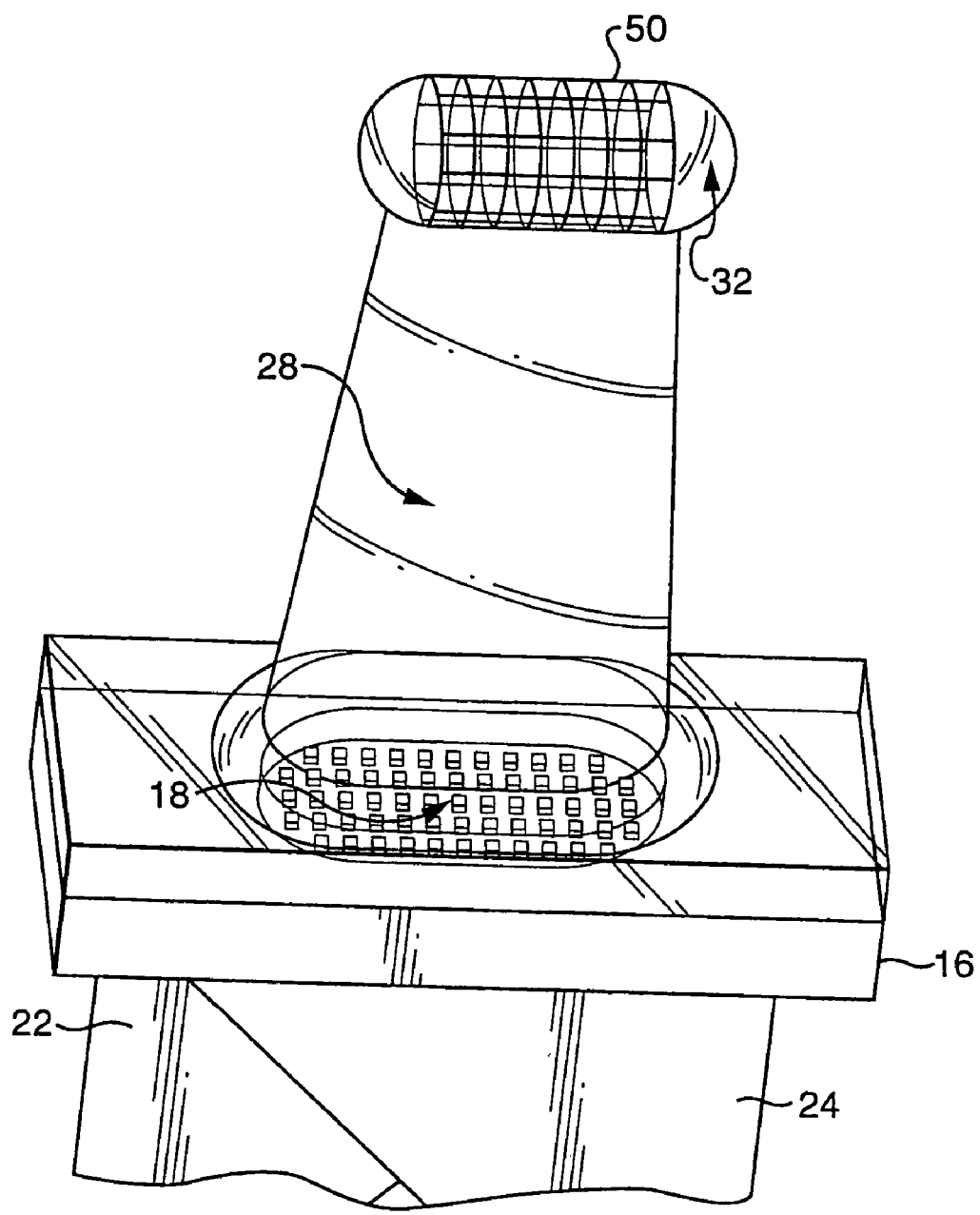
FIG. 5 is a diagrammatic perspective view of an LED layout, light pipe and light radiator.

A light radiator 34 is affixed to the terminal end 30 and a light opaque shroud 33 surrounds the light pipe 28 to keep the light generated by the solid-state light source from exiting the light pipe 28 other than through the light radiator 34. The light radiator 34 is preferably chosen from the same material as the light pipe 28, and if not molded as an original extension of the light pipe 28 may be attached by any suitable method to the light pipe 28, such as by gluing with a light-transparent glue. Additionally, the radiator 34 can be formed with helical grooves 50 as shown in FIG. 5, or facets to further mimic the spectral emission of an incandescent source. One of the advantages of this solid-state light source is the positioning of the centerline 52 of the radiator 34 at the same relative height as the centerline 130 of the incandescent bulb 120. This allows the solid-state light source to use all of the advantages of the lamp reflector, something that was not achieved by previous attempts at substituting solid-state light sources for incandescent ones.

The shroud 33 may be made in two halves, or hinged as a clamshell to envelope the majority of the light pipe 28, the circuit board 16, the LEDs 18 and the contacts 22, 24. The contacts 22 and 24 initially have straight legs 40. The halves of the shroud 33 may close one to the other and to be bonded in the assembly. The exposed leg ends 40 of the contacts 22, 24 are then bent up over the sides of the shroud 33 and housing to be located in the axial direction along the exterior of the lamp base. The light pipe 28 is designed to provide total internal reflection of the generated light, at least along the main shaft portion of the light pipe 28. The light transmitted through the light pipe 28 is then emitted in the filament like head portion, light radiator 34. There are numerous ways of making the shroud 33. It is a matter of design choice as to how to sheath the internal assembly to enclose the light pipe, the LEDs on the circuit board and the electrical contacts with the shroud, and the base. To aid in inserting the light source 10 into a socket it is preferred that the outer surface of the shroud 33 be roughened, as by knurling or pebbling, as is shown at 35 in FIG. 2.

Figure 7:
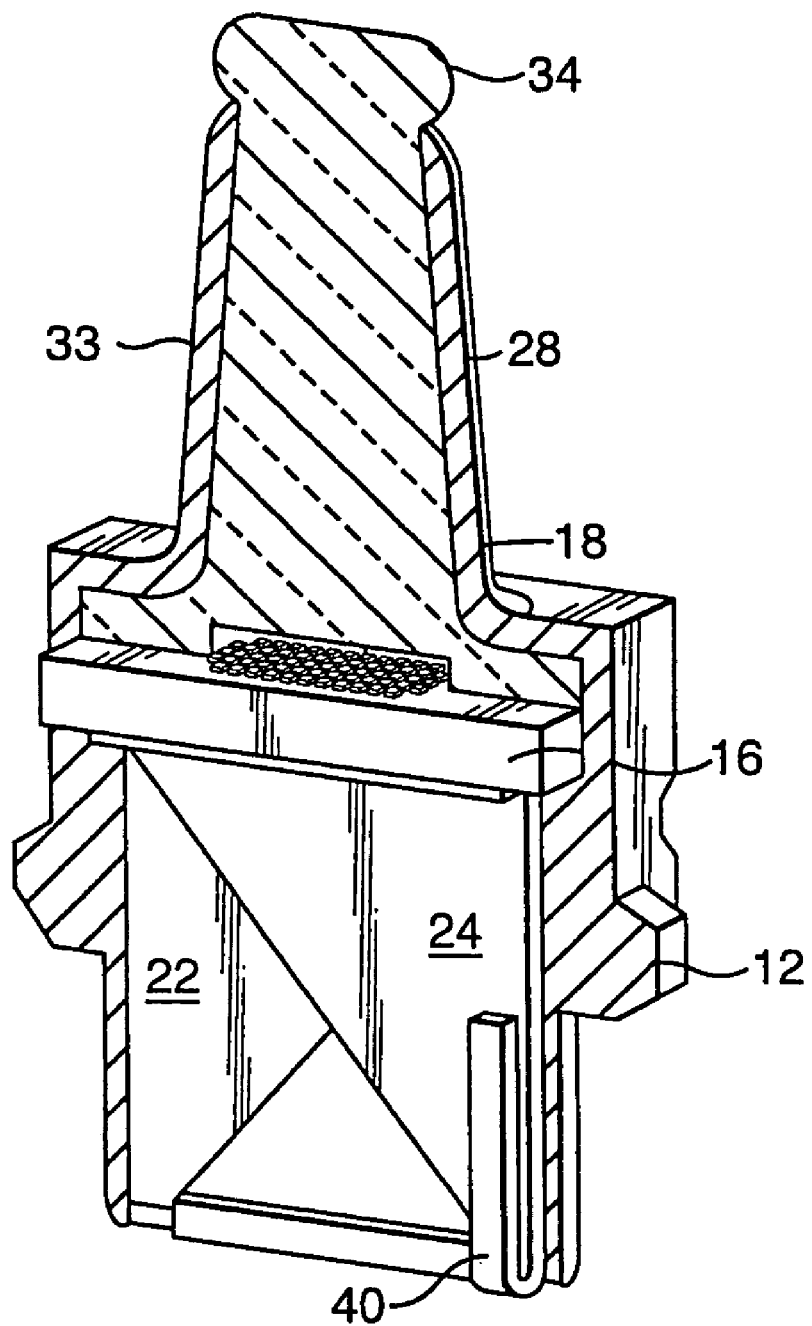
FIG. 7 shows a cross sectional, schematic view of a preferred embodiment of the lamp.

FIG. 7 shows a cross sectional, schematic view of a preferred embodiment of the lamp. The electrical contacts 22 and 24 are mated to the second side of the circuit board 16 for electrical contact. The first side 20 of the circuit board 16 supports an array of LEDs 18. Enclosing and extending away from the LEDs 18 is a light pipe 28 ending at a light radiator 34 shaped and positioned to mimic the characteristics of a standard radiator, in this case a filament. Surrounding the light pipe 28 is a shroud 33. The shroud 33 substantially blocks light from emerging prematurely in patterns different from that of the lamp being the mimiced. In this embodiment the shroud 33 is formed as an extension of the base 12. This embodiment may be formed by forming a subassembly of the circuit board 16, the contacts 22, 24, the light pipe 28 and optionally the radiator 34. The subassembly may then be insert molded as an inclusion in an outer shell forming the base and shroud. The surrounding shell forming the base and shroud may equally be assembled be as several pieces glued, sonically welded, or similarly assembled by known methods. The contact ends 40 are then bent into place and depending on the option, the radiator 34 is attached if necessary.

Accordingly there is provided a solid-state light source that mimics the spectral distribution of filamented lamps while maintaining all of the desirable qualities of the solid-state source, such as long life and great resistance to shock.

While there have been shown and described what are at present considered to be the preferred embodiments of the invention, it will be apparent to those skilled in the art that various changes and modification can be made herein without departing from the scope of the invention as defined by the appended claims.

What is claimed is:

1. A solid-state light source compatible with existing sockets normally reserved for filamented lamps comprising:
 a hollow base formed to mechanically and electrically adapt to a socket; and
 a sub-assembly adapted to cooperate with and fit into said hollow base, said sub-assembly comprising:
 a circuit board;
 a plurality of LED chip light sources mechanically and electrically connected directly chip on board to a first side of said circuit board;
 two electrical contacts positioned on a second side of said circuit board for connection to an electrical circuit;
 a light pipe covering said plurality of light sources and extending away therefrom to a terminal end;
 a light radiator affixed to said terminal end; and
 a light-opaque shroud surrounding said light pipe.

2. The solid-state light source of claim 1 wherein said light pipe comprises an optically clear material.

3. The solid-state light source of claim 1 wherein said light radiator comprises an optically clear material.

4. The solid-state light source of claim 3 wherein said optically clear material is selected from the group consisting of glass, polycarbonate, or any suitable plastic.

5. The solid-state light source of claim 4 wherein said light radiator mimics the emission characteristics of an incandescent coil.

6. The solid-state light source of claim 1 wherein the outer surface of said shroud is roughened.

* * * * *